(12) United States Patent
Furumiya et al.

(10) Patent No.: US 8,350,357 B2
(45) Date of Patent: Jan. 8, 2013

(54) SEMICONDUCTOR DEVICE INCLUDING AN INDUCTOR THAT IS INDUCTIVELY COUPLED TO ANOTHER INDUCTOR

(75) Inventors: Masayuki Furumiya, Kawasaki (JP); Yasutaka Nakashiba, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 271 days.

(21) Appl. No.: 12/662,441

(22) Filed: Apr. 16, 2010

(65) Prior Publication Data
US 2010/0270642 A1    Oct. 28, 2010

(30) Foreign Application Priority Data
Apr. 20, 2009 (JP) .................... 2009-101860

(51) Int. Cl.
*H01F 38/02* (2006.01)
*H01F 38/14* (2006.01)
*G05F 3/04* (2006.01)
*H01L 23/538* (2006.01)
*H01L 23/64* (2006.01)

(52) U.S. Cl. ......... 257/531; 257/784; 323/355; 327/565

(58) Field of Classification Search .................. 257/531, 257/784, E23.168, E23.169, E23.175; 323/355; 327/565
See application file for complete search history.

(56) References Cited

U.S. PATENT DOCUMENTS
3,997,851 A * 12/1976 Sechi .................... 330/286
5,382,846 A * 1/1995 Shigehara et al. ........... 326/68
6,545,227 B2 * 4/2003 Silverman .................. 174/260

FOREIGN PATENT DOCUMENTS
JP  10-74625   3/1998
JP  2005-39023   2/2005

* cited by examiner

*Primary Examiner* — Evan Pert
(74) *Attorney, Agent, or Firm* — McGinn IP Law Group PLLC (57) ABSTRACT

A first inductor is connected to a transmission circuit. A second inductor is connected to a reception circuit, and is inductively coupled to the first inductor. At least part of the first inductor is formed with a first bonding wire. The first bonding wire has two ends connected to a first connecting terminal and a third connecting terminal. At least part of the second inductor is formed with a second bonding wire. The second bonding wire has two ends connected to a second connecting terminal and a fourth connecting terminal.

20 Claims, 6 Drawing Sheets

SEALING RESIN

SEMICONDUCTOR DEVICE INCLUDING AN INDUCTOR THAT IS INDUCTIVELY COUPLED TO ANOTHER INDUCTOR

This application is based on Japanese patent application No. 2009-101860, the content of which is incorporated herein by reference.

BACKGROUND

1. Technical Field

The present invention relates to a semiconductor device that is capable of transferring electric signals between two circuits to which electric signals having different potentials from each other are input.

2. Related Art

To transfer electric signals between two circuits to which electric signals having different potentials from each other are input, photo couplers are often used. Each photo coupler includes a light emitting element such as a light emitting diode and a light receiving element such as a photo transistor. The light emitting element converts an input electric signal into light, and the light receiving element returns the light to an electric signal. In this manner, photo couplers transfer electric signals.

However, it is difficult to reduce the size of each photo coupler due to the existence of the light emitting element and the light receiving element. Also, where the frequency of electric signals is high, the photo couplers cannot follow the electric signals.

Inductor elements that are formed with the use of bonding wires are disclosed in Japanese Laid-open patent publication NO. 2005-39023 and Japanese Published patent application A-H10-74625.

The present inventors have recognized as follows. To transfer electric signals between two circuits to which electric signals having different potentials from each other are input, electric signals are transferred by inductively coupling the two inductors to each other. In this case, to reduce transmission errors, the coefficient of coupling between the inductors needs to be made larger. To form the two inductors that are inductively coupled to each other, spiral inductors may be stacked on each other. However, spiral inductors are often formed with interconnect layers of a semiconductor device. Therefore, it is difficult to increase the diameter of each inductor. As a result, the coefficient of coupling between two inductors cannot be made larger.

SUMMARY

In one embodiment, there is provided a semiconductor device including a first region that includes a transmission circuit, a first connecting terminal, and a second connecting terminal, a second region that is placed alongside the first region, has a reference potential isolated from the first region, and includes a reception circuit, a third connecting terminal, and a fourth connecting terminal, a first inductor that is connected to the transmission circuit, a second inductor that is connected to the reception circuit, and is inductively coupled to the first inductor, a first bonding wire that forms at least part of the first inductor, and has two ends connected to the first connecting terminal and the third connecting terminal, and a second bonding wire that forms at least part of the second inductor, and has two ends connected to the second connecting terminal and the fourth connecting terminal.

According to the embodiment, at least part of the first inductor is formed with the first bonding wire, and at least part of the second inductor is formed with the second bonding wire. With this arrangement, the diameter of the first inductor and the diameter of the second inductor can be made larger. Accordingly, the coefficient of coupling between the two inductors can be made larger.

As described above, according to the present invention, the coefficient of coupling between two inductors can be increased where electric signals are transferred by inductively coupling the two inductors to each other.

BRIEF DESCRIPTION OF THE DRAWINGS OF PREFERRED EMBODIMENTS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a description of embodiments of the present invention, with reference to the accompanying drawings. In the drawings, like components are denoted by like reference numerals, and explanation thereof will not be repeated in the following description.

First Embodiment

Figure 1:
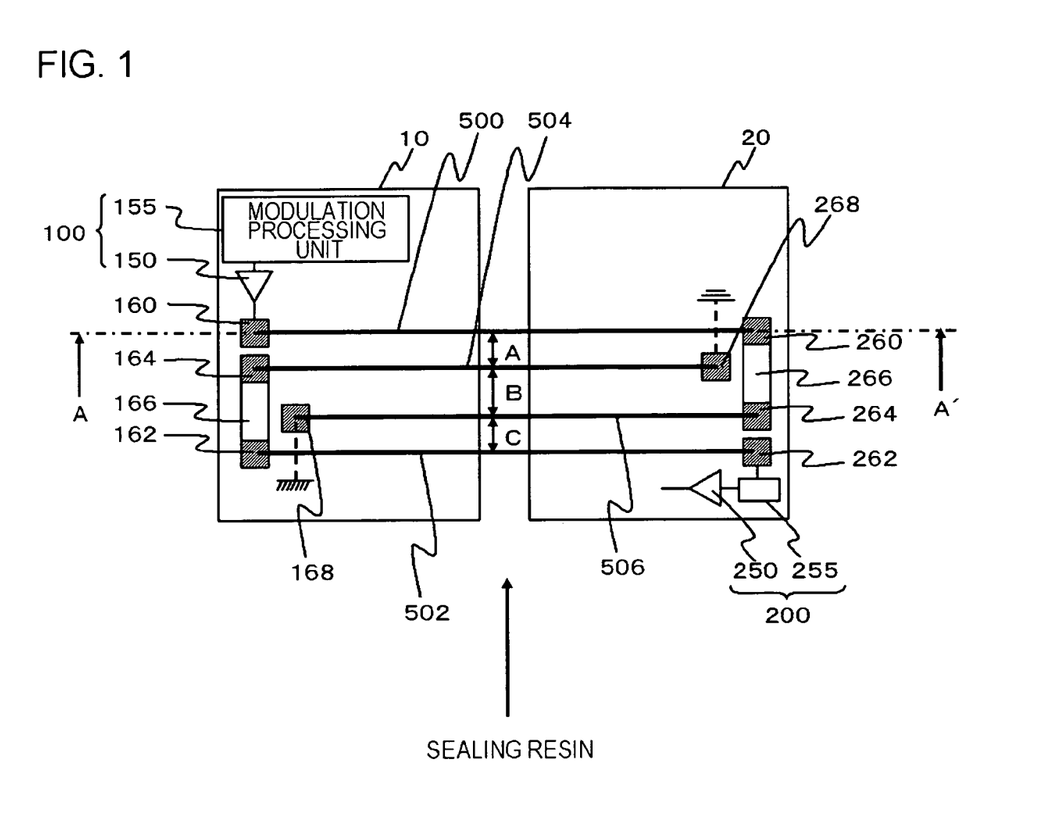
FIG. 1 is a schematic plan view showing the structure of a semiconductor device according to a first embodiment.

FIG. 1 is a schematic plan view showing the structure of a semiconductor device according to a first embodiment. This semiconductor device includes a first semiconductor chip 10 as a first region, a second semiconductor chip 20 as a second region, a first inductor, a second inductor, a first bonding wire 500, and a second bonding wire 502.

The first semiconductor chip 10 includes a transmission circuit 100, a first connecting terminal 160, and a second connecting terminal 162. The second semiconductor chip 20 is placed alongside the first semiconductor chip 10, and has a reference potential isolated from the first semiconductor chip 10. The second semiconductor chip 20 includes a reception circuit 200, a third connecting terminal 260, and a fourth connecting terminal 262. The first inductor is connected to the transmission circuit 100. The second inductor is connected to the reception circuit 200, and is inductively coupled to the first inductor. At least part of the first inductor is formed with the first bonding wire 500. The first bonding wire 500 has two ends connected to the first connecting terminal 160 and the third connecting terminal 260. At least part of the second inductor is formed with the second bonding wire 502. The second bonding wire 502 has two ends connected to the second connecting terminal 162 and the fourth connecting terminal 262. The first connecting terminal 160 is connected to the transmission circuit 100, and the fourth connecting terminal 262 is connected to the reception circuit 200. In this embodiment, each of the connecting terminals may be a pad, for example.

In this embodiment, the first inductor is formed with the first bonding wire 500, an interconnect 266 formed in the second semiconductor chip 20, and a third bonding wire 506. The second inductor is formed with the second bonding wire 502, an interconnect 166 formed in the first semiconductor chip 10, and a fourth bonding wire 504.

The first semiconductor chip 10 further includes the interconnect 166, a fifth connecting terminal 164, and a sixth connecting terminal 168. The fifth connecting terminal 164 is connected to the second connecting terminal 162 through the interconnect 166. Where the second connecting terminal 162 and the fifth connecting terminal 164 are pads, the interconnect 166 is connected to the same interconnect layer to which those pads are connected, but may be formed in an interconnect layer located below those pads. The sixth connecting terminal 168 is connected to the reference potential of the first semiconductor chip 10.

Meanwhile, the second semiconductor chip 20 further includes the interconnect 266, a seventh connecting terminal 264, and an eighth connecting terminal 268. The seventh connecting terminal 264 is connected to the third connecting terminal 260 through the interconnect 266. Where the third connecting terminal 260 and the seventh connecting terminal 264 are pads, the interconnect 266 is connected to the same interconnect layer to which those pads are connected, but may be formed in an interconnect layer located below those pads. The eighth connecting terminal 268 is connected to the reference potential of the second semiconductor chip 20.

The third bonding wire 506 has two ends connected to the sixth connecting terminal 168 and the seventh connecting terminal 264, and the fourth bonding wire 504 has two ends connected to the fifth connecting terminal 164 and the eighth connecting terminal 268. The third bonding wire 506 is located between the first bonding wire 500 and the second bonding wire 502, and the fourth bonding wire 504 is located between the first bonding wire 500 and the third bonding wire 506. The distance B between the third bonding wire 506 and the fourth bonding wire 504 is longer than the distance A between the first bonding wire 500 and the fourth bonding wire 504, and the distance C between the second bonding wire 502 and the third bonding wire 506.

The first bonding wire 500 and the fourth bonding wire 504 are parallel to each other, and the second bonding wire 502 and the third bonding wire 506 are parallel to each other. In the example illustrated in this drawing, the first bonding wire 500, the second bonding wire 502, the third bonding wire 506, and the fourth bonding wire 504 are all parallel to one another. When seen along the center axis of the arc formed by the first bonding wire 500, there are overlapping portions among the arc formed by the first bonding wire 500, the arc formed by the second bonding wire 502, the arc formed by the third bonding wire 506, and the arc formed by the fourth bonding wire 504.

Where the center point of the first semiconductor chip 10 is the reference point, the first connecting terminal 160, the second connecting terminal 162, the interconnect 166, the fifth connecting terminal 164, and the sixth connecting terminal 168 are located on the opposite side from the second semiconductor chip 20. Where the center point of the second semiconductor chip 20 is the reference point, the third connecting terminal 260, the fourth connecting terminal 262, the interconnect 266, the seventh connecting terminal 264, and the eighth connecting terminal 268 are located on the opposite side from the first semiconductor chip 10.

More specifically, the planar shapes of the first semiconductor chip 10 and the second semiconductor chip 20 are rectangles or squares. The first connecting terminal 160, the second connecting terminal 162, the interconnect 166, the fifth connecting terminal 164, and the sixth connecting terminal 168 are formed on a side of the first semiconductor chip 10, with the side being located on the opposite side from the second semiconductor chip 20. The third connecting terminal 260, the fourth connecting terminal 262, the interconnect 266, the seventh connecting terminal 264, and the eighth connecting terminal 268 are formed on a side of the second semiconductor chip 20, with the side being located on the opposite side from the first semiconductor chip 10.

The transmission circuit 100 includes a modulation processing unit 155 that modulates a digital signal into a signal to be transmitted, and a transmission-side driver circuit 150 that outputs the modulated signal to the first connecting terminal 160. The reception circuit 200 includes a demodulation circuit 255 that is connected to the fourth connecting terminal 262, and a reception-side driver circuit 250 (such as a gate driver). The demodulation circuit 255 demodulates the modulated signal into a digital signal. The digital signal demodulated by the demodulation circuit 255 is output to the reception-side driver circuit 250.

Although the potentials of electric signals to be input to the transmission circuit 100 and the reception circuit 200 differ from each other, no trouble occurs in the transmission circuit 100 and the reception circuit 200, since the first inductor and the second inductor transmit and receive the electric signals by virtue of inductive coupling. Where "the potentials of electric signals to be input differ from each other", the amplitudes (the differences between the potential indicating "0" and the potential indicating "1") of the electric signals might differ from each other, the reference potentials (the potentials indicating "0") of the electric signals might differ from each other, the amplitudes of the electric signals might differ from each other while the reference potentials of the electric signals differ from each other, or the like.

In such a structure, each transmission signal that is output from the transmission circuit 100 is transmitted through the first bonding wire 500, the interconnect 266, and the third bonding wire 506 in this order. At this point, by virtue of the magnetic fields generated from the first bonding wire 500 and the third bonding wire 506, the first bonding wire 500 and the third bonding wire 506 are inductively coupled to each other, and the second bonding wire 502 and the fourth bonding wire 504 are inductively coupled to each other. The transmission signal is then transmitted to the second bonding wire 502 and the fourth bonding wire 504. The signal received by the second bonding wire 502 and the fourth bonding wire 504 is transmitted to the reception circuit 200 through the fourth connecting terminal 262.

Figure 2:
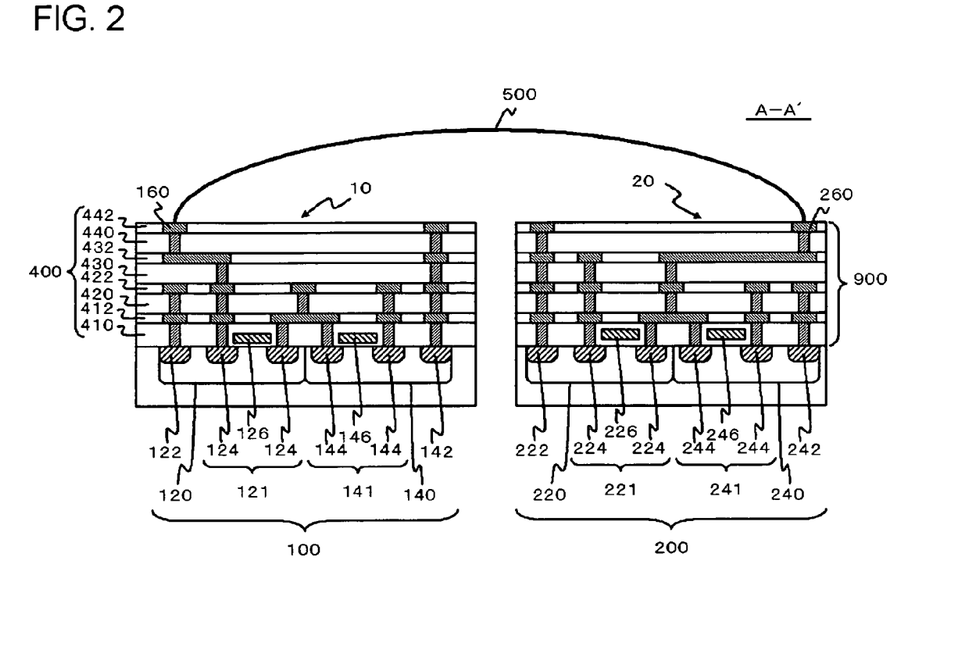
FIG. 2 is a cross-sectional view of the semiconductor device, taken along the line A-A' of FIG. 1.

FIG. 2 is a cross-sectional view of the semiconductor device, taken along the line A-A' of FIG. 1. The transmission circuit 100 of the first semiconductor chip 10 includes first transistors. The first transistors are an n-type transistor and a p-type transistor. An n-type first transistor 121 is formed in a p-type well 120, and includes two n-type impurity regions 124 to be the source and drain, and a gate electrode 126. A p-type first transistor 141 is formed in an n-type well 140, and includes two p-type impurity regions 144 to be the source and drain, and a gate electrode 146. A gate insulating film is provided below each of the gate electrodes 126 and 146. Those two gate insulating films have substantially the same thicknesses. The first transistors 121 and 141 constitute the above-mentioned transmission-side driver circuit that is an inverter, for example.

A p-type impurity region 122 is formed in the well 120, and an n-type impurity region 142 is formed in the well 140. An interconnect for applying the reference potential (the ground potential) of the n-type first transistor 121 is connected to the impurity region 122, and an interconnect for applying the power-supply potential of the p-type first transistor 141 is connected to the impurity region 142.

The reception circuit 200 of the second semiconductor chip 20 includes second transistors. The second transistors are an n-type transistor and a p-type transistor. An n-type second transistor 221 is formed in a p-type well 220, and includes two n-type impurity regions 224 to be the source and drain, and a gate electrode 226. A p-type second transistor 241 is formed in an n-type well 240, and includes two p-type impurity regions 244 to be the source and drain, and a gate electrode 246. A gate insulating film is provided below each of the gate electrodes 226 and 246. The second transistors 221 and 241 constitute the above-mentioned reception-side driver circuit 250 and the demodulation circuit 255.

A p-type impurity region 222 is formed in the well 220, and an n-type impurity region 242 is formed in the well 240. An interconnect for applying the reference potential of the n-type second transistor 221 is connected to the impurity region 222, and an interconnect for applying the power-supply potential of the p-type second transistor 241 is connected to the impurity region 242.

In the example illustrated in this drawing, the gate insulating films of the first transistors 121 and 141 and the gate insulating films of the second transistors 221 and 241 have different thicknesses from each other. However, those gate insulating films may have the same thicknesses.

The first semiconductor chip 10 includes a multilayer interconnect layer 400, and the second semiconductor chip 20 includes a multilayer interconnect layer 900. In each of the multilayer interconnect layers 400 and 900, t or more insulating layers and t or more interconnect layers (t≧3) are alternately stacked, with an insulating layer being at the lowermost layer. In this embodiment, the multilayer interconnect layer 400 has a structure that is formed by stacking an insulating layer 410, an interconnect layer 412, an insulating layer 420, an interconnect layer 422, an insulating layer 430, an interconnect layer 432, an insulating layer 440, and an interconnect layer 442 in this order. Each of the insulating layers 410, 420, 430, and 440 may have a structure formed by stacking insulating films, or may be a single insulating film.

The interconnects located in the interconnect layers 412, 422, 432, and 442 are Cu interconnects formed by the damascene technique, and are buried in grooves formed in the respective interconnect layers 412, 422, 432, and 442. Each of the connecting terminals (such as the first connecting terminal 160) of the first semiconductor chip 10 shown in FIG. 1 is formed on the interconnect in the uppermost layer. Alternatively, at least one of the interconnect layers 412, 422, 432, and 442 may be an Al-alloy interconnect. The interconnects formed in the interconnect layers 412, 422, 432, and 442 are connected to one another through plugs buried in the insulating layers 410, 420, 430, and 440.

In the multilayer interconnect layer 900, the interconnects are also Cu interconnects formed by the damascene technique, for example. However, at least one of the interconnect layers may be an Al-alloy interconnect. Each of the connecting terminals (such as the third connecting terminal 260) of the second semiconductor chip 20 shown in FIG. 1 is formed on the interconnect in the uppermost layer. The number of layers in the multilayer interconnect layer 900 may be the same as or differ from the number of layers in the multilayer interconnect layer 400.

Figure 3:
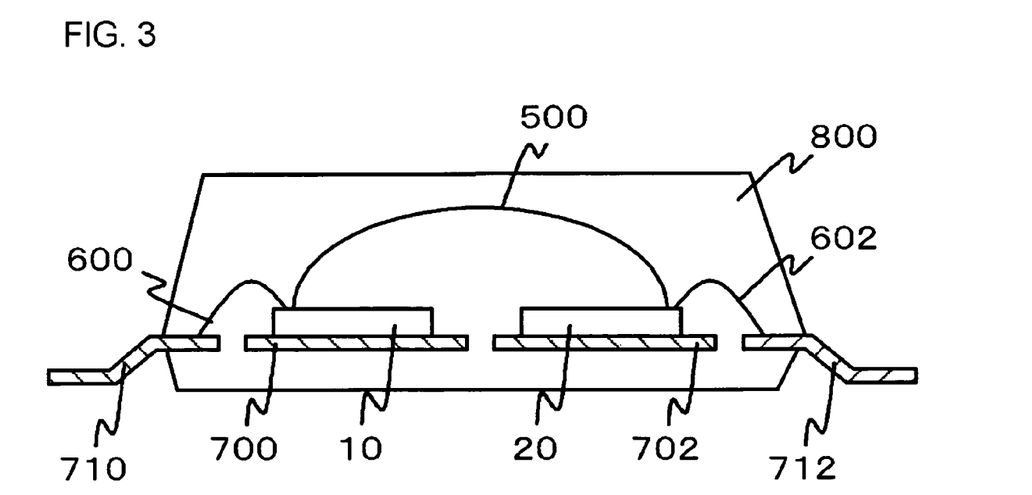
FIG. 3 is a cross-sectional view showing a structure in which a first semiconductor chip and a second semiconductor chip shown in FIGS. 1 and 2 are mounted on a lead frame that serves as an interconnect substrate.

FIG. 3 is a cross-sectional view showing a structure in which the first semiconductor chip 10 and the second semiconductor chip 20 shown in FIGS. 1 and 2 are mounted on a lead frame as an interconnect substrate. The lead frame includes die pads 700 and 702, and leads 710 and 712. The first semiconductor chip 10 is mounted on the die pad 700, and the second semiconductor chip 20 is mounted on the die pad 702. The first semiconductor chip 10 is connected to the lead 710 through a connecting bonding wire 600, and the second semiconductor chip 20 is connected to the lead 712 through a connecting bonding wire 602.

The top portions of the first bonding wire 500, the second bonding wire 502, the third bonding wire 506, and the fourth bonding wire 504 are located higher than the connecting bonding wires 600 and 602. Accordingly, the diameters of the first bonding wire 500, the second bonding wire 502, the third bonding wire 506, and the fourth bonding wire 504 can be made larger.

The first semiconductor chip 10, the second semiconductor chip 20, the lead frame, the first through fourth bonding wires 500 through 506, and the connecting bonding wires 600 and 602 are sealed with a resin layer 800. The resin layer 800 is formed by introducing a sealing resin into a metal mold, for example. Here, the resin is injected from a direction perpendicular to the first through fourth bonding wires 500 through 506 (see the arrow in FIG. 1), so that deformation of the first through fourth bonding wires 500 through 506 can be restrained at the time of resin injection.

Next, the functions and effects of this embodiment are described. In this embodiment, part of the first inductor is formed with the first bonding wire 500 and the fourth bonding wire 504, and part of the second inductor is formed with the second bonding wire 502 and the third bonding wire 506. The first bonding wire 500 and the fourth bonding wire 504 are inductively coupled to the second bonding wire 502 and the third bonding wire 506. Where inductors are formed with bonding wires, the diameters can be more easily enlarged than in a case where inductors are formed with interconnect layers of a semiconductor device. Accordingly, the coefficient of coupling between the first inductor and the second inductor can be made larger. In this manner, the signal transmission error between the first inductor and the second inductor can be reduced.

The first bonding wire 500 is connected to the first connecting terminal 160 of the first semiconductor chip 10 and the third connecting terminal 260 of the second semiconductor chip 20. The second bonding wire 502 is connected to the second connecting terminal 162 of the first semiconductor chip 10 and the fourth connecting terminal 262 of the second semiconductor chip 20. Where the center point of the first semiconductor chip 10 is the reference point, the first connecting terminal 160 and the second connecting terminal 162 are located on the opposite side from the second semiconductor chip 20. Where the center point of the second semiconductor chip 20 is the reference point, the third connecting terminal 260 and the fourth connecting terminal 262 are located on the opposite side from the first semiconductor chip 10. Accordingly, the diameter of the first bonding wire 500 and the diameter of the second bonding wire 502 can be made larger. Particularly, in this embodiment, the first semiconductor chip 10 and the second semiconductor chip 20 have rectangular shapes or square shapes. The first connecting terminal 160 and the second connecting terminal 162 are formed on a side located on the opposite side from the second semiconductor chip 20, and the third connecting terminal 260 and the fourth connecting terminal 262 are formed on a side located on the opposite side from the first semiconductor chip 10. Accordingly, the diameter of the first bonding wire 500 and the diameter of the second bonding wire 502 can be made particularly large.

In this embodiment, the third bonding wire 506 is further provided to return the first inductor to the first semiconductor chip 10 and supply the reference potential of the first semiconductor chip 10, and the fourth bonding wire 504 is further provided to return the second inductor to the second semiconductor chip 20 and supply the reference potential of the second semiconductor chip 20. The third bonding wire 506 is located between the first bonding wire 500 and the second bonding wire 502, and the fourth bonding wire 504 is located between the first bonding wire 500 and the third bonding wire 506. With this arrangement, the bonding wires forming the first inductor and the bonding wires forming the second inductors are alternately located, and, accordingly, the coefficient of coupling between the first inductor and the second inductor becomes larger.

Further, in this embodiment, the distance B between the third bonding wire 506 and the fourth bonding wire 504 is longer than the distance A between the first bonding wire 500 and the fourth bonding wire 504, and the distance C between the second bonding wire 502 and the third bonding wire 506. Accordingly, the distance between the first bonding wire 500 and the fourth bonding wire 504, and the distance between the second bonding wire 502 and the third bonding wire 506 can be made shorter, while the distance between the first bonding wire 500 and the third bonding wire 506, and the distance between the second bonding wire 502 and the fourth bonding wire 504 are secured. Accordingly, the coefficient of coupling between the first inductor and the second inductor becomes even larger.

Second Embodiment

Figure 4:
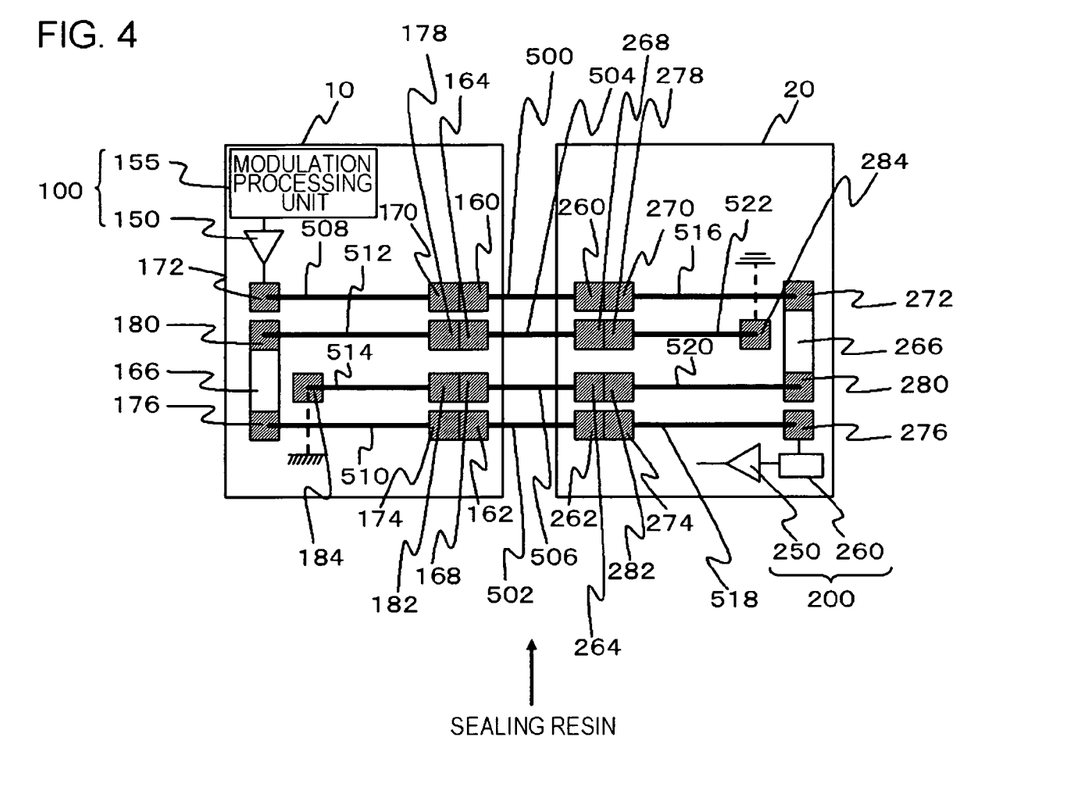
FIG. 4 is a schematic plan view showing the structure of a semiconductor device according to a second embodiment.

FIG. 4 is a schematic plan view showing the structure of a semiconductor device according to a second embodiment. This semiconductor device is the same as the semiconductor device according to the first embodiment, except that each of the first bonding wire 500, the second bonding wire 502, the third bonding wire 506, and the fourth bonding wire 504 of the first embodiment is divided into a plurality of bonding wires.

More specifically, a first connecting terminal 160, a second connecting terminal 162, a fifth connecting terminal 164, and a sixth connecting terminal 168 are provided on a side of a first semiconductor chip 10, with the side facing a second semiconductor chip 20. A third connecting terminal 260, a fourth connecting terminal 262, a seventh connecting terminal 264, and an eighth connecting terminal 268 are provided on a side of the second semiconductor chip 20, with the side facing the first semiconductor chip 10. The first connecting terminal 160 is not connected directly to a transmission circuit 100, and the sixth connecting terminal 168 is not connected directly to the reference potential of the first semiconductor chip 10. The fourth connecting terminal 262 is not connected directly to a reception circuit 200, and the eighth connecting terminal 268 is not connected directly to the reference potential of the second semiconductor chip 20.

The first semiconductor chip 10 includes a ninth connecting terminal 170, a tenth connecting terminal 172, an eleventh connecting terminal 174, a twelfth connecting terminal 176, connecting terminals 178, 180, 182, and 184, a fifth bonding wire 508, a sixth bonding wire 510, and bonding wires 512 and 514.

The ninth connecting terminal 170 is connected to the first connecting terminal 160, and the tenth connecting terminal 172 is connected to the transmission circuit 100. The fifth bonding wire 508 has one end connected to the ninth connecting terminal 170, and has the other end connected to the tenth connecting terminal 172. In other words, the first connecting terminal 160 is connected to the transmission circuit 100 through the ninth connecting terminal 170, the fifth bonding wire 508, and the tenth connecting terminal 172.

The eleventh connecting terminal 174 is connected to the second connecting terminal 162, and the twelfth connecting terminal 176 is connected to an interconnect 166. The sixth bonding wire 510 has one end connected to the eleventh connecting terminal 174, and has the other end connected to the twelfth connecting terminal 176. The connecting terminal 178 is connected to the fifth connecting terminal 164, and the connecting terminal 180 is connected to the interconnect 166. The bonding wire 512 has one end connected to the connecting terminal 178, and has the other end connected to the connecting terminal 180.

With this arrangement, the second connecting terminal 162 is connected to the fifth connecting terminal 164 through the eleventh connecting terminal 174, the sixth bonding wire 510, the twelfth connecting terminal 176, the interconnect 166, the connecting terminal 180, the bonding wire 512, and the connecting terminal 178.

The connecting terminal 182 is connected to the sixth connecting terminal 168, and the connecting terminal 184 is connected to the reference potential of the first semiconductor chip 10. The bonding wire 514 has one end connected to the connecting terminal 182, and has the other end connected to the connecting terminal 184. In other words, the sixth connecting terminal 168 is connected to the reference potential through the connecting terminal 182, the bonding wire 514, and the connecting terminal 184.

The second semiconductor chip 20 includes a thirteenth connecting terminal 270, a fourteenth connecting terminal 272, a fifteenth connecting terminal 274, a sixteenth connecting terminal 276, connecting terminals 278, 280, 282, and 284, a seventh bonding wire 516, an eighth bonding wire 518, and bonding wires 520 and 522.

The thirteenth connecting terminal 270 is connected to the third connecting terminal 260, and the fourteenth connecting terminal 272 is connected to an interconnect 266. The seventh bonding wire 516 has one end connected to the thirteenth connecting terminal 270, and has the other end connected to the fourteenth connecting terminal 272. The connecting terminal 280 is connected to the interconnect 266, and the connecting terminal 282 is connected to the seventh connecting terminal 264. The bonding wire 520 has one end connected to the connecting terminal 280, and has the other end connected to the connecting terminal 282.

With this arrangement, the third connecting terminal 260 is connected to the seventh connecting terminal 264 through the thirteenth connecting terminal 270, the seventh bonding wire 516, the fourteenth connecting terminal 272, the interconnect 266, the connecting terminal 280, the bonding wire 520, and the connecting terminal 282.

The fifteenth connecting terminal 274 is connected to the fourth connecting terminal 262, and the sixteenth connecting terminal 276 is connected to the reception circuit 200. The eighth bonding wire 518 has one end connected to the fifteenth connecting terminal 274, and has the other end connected to the sixteenth connecting terminal 276. In other words, the fourth connecting terminal 262 is connected to the reception circuit 200 through the fifteenth connecting terminal 274, the eighth bonding wire 518, and the sixteenth connecting terminal 276.

The connecting terminal 278 is connected to the eighth connecting terminal 268, and the connecting terminal 284 is connected to the reference potential of the second semiconductor chip 20. The bonding wire 522 has one end connected to the connecting terminal 278, and has the other end connected to the connecting terminal 284. In other words, the eighth connecting terminal 268 is connected to the reference potential of the second semiconductor chip 20 through the connecting terminal 278, the bonding wire 522, and the connecting terminal 284.

The bonding wire 512 is located between the fifth bonding wire 508 and the sixth bonding wire 510, and the bonding wire 514 is located between the bonding wire 512 and the sixth bonding wire 510. When seen along the center axis of the arc formed by the fifth bonding wire 508, at least portions among the arc formed by the fifth bonding wire 508, the arc formed by the sixth bonding wire 510, and the arcs formed by the bonding wires 512 and 514 overlap.

Meanwhile, the bonding wire 522 is located between the seventh bonding wire 516 and the eighth bonding wire 518, and the bonding wire 520 is located between the bonding wire 522 and the eighth bonding wire 518. When seen along the center axis of the arc formed by the seventh bonding wire 516, at least portions among the arc formed by the seventh bonding wire 516, the arc formed by the eighth bonding wire 518, and the arcs formed by the bonding wires 520 and 522 overlap.

When seen in a plan view, the first bonding wire 500, the fifth bonding wire 508, and the seventh bonding wire 516 extend on the same straight line. Likewise, the fourth bonding wire 504 and the bonding wires 512 and 522 extend on the same straight line. The third bonding wire 506 and the bonding wires 514 and 520 extend on the same straight line. The second bonding wire 502, the sixth bonding wire 510, and the eighth bonding wire 518 extend on the same straight line. The tenth connecting terminal 172, the twelfth connecting terminal 176, and the connecting terminals 180 and 184 are formed on a side of the first semiconductor chip 10, with the side being located on the opposite side from the second semiconductor chip 20. The fourteenth connecting terminal 272, the sixteenth connecting terminal 276, and the connecting terminals 280 and 284 are formed on a side of the semiconductor chip 20, with the side being located on the opposite side from the first semiconductor chip 10.

In this structure, the fifth bonding wire 508, the first bonding wire 500, the seventh bonding wire 516, the interconnect 266, the bonding wire 520, the third bonding wire 506, and the bonding wire 514 constitute the first inductor. The eighth bonding wire 518, the second bonding wire 502, the sixth bonding wire 510, the interconnect 166, the bonding wire 512, the fourth bonding wire 504, and the bonding wire 522 constitute the second inductor.

Each transmission signal that is output from the transmission circuit 100 is transmitted through the fifth bonding wire 508, the first bonding wire 500, the seventh bonding wire 516, the interconnect 266, the bonding wire 520, the third bonding wire 506, and the bonding wire 514 in this order. The fifth bonding wire 508 is inductively coupled to the bonding wire 512, the first bonding wire 500 is inductively coupled to the fourth bonding wire 504, and the seventh bonding wire 516 is inductively coupled to the bonding wire 522. The bonding wire 520 is inductively coupled to the eighth bonding wire 518, the third bonding wire 506 is inductively coupled to the second bonding wire 502, and the bonding wire 514 is inductively coupled to the sixth bonding wire 510. With this arrangement, each transmission signal is transmitted to the reception circuit 200 through the first inductor and the second inductor.

This embodiment can achieve the same effects as those of the first embodiment. Since the diameter of each bonding wire can be made smaller than in the first embodiment, deformation of each bonding wire can be further restrained when the sealing resin is injected into a metal mold.

Third Embodiment

Figure 5:
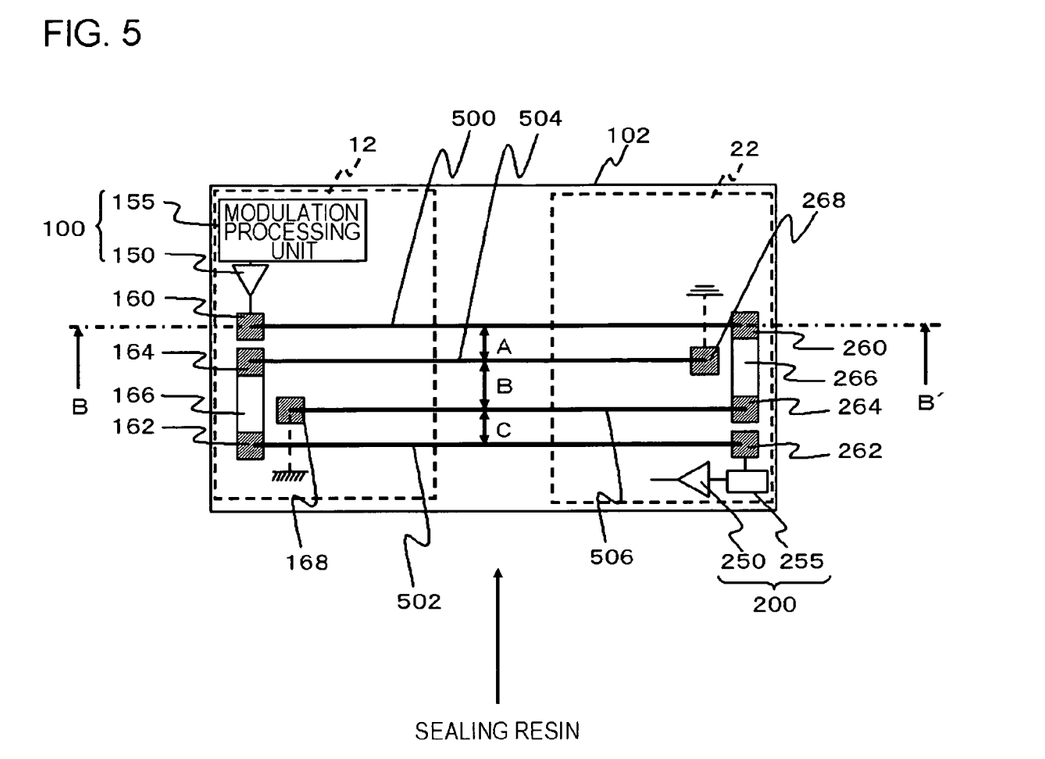
FIG. 5 is a schematic plan view of a semiconductor device according to a third embodiment.
Figure 6:
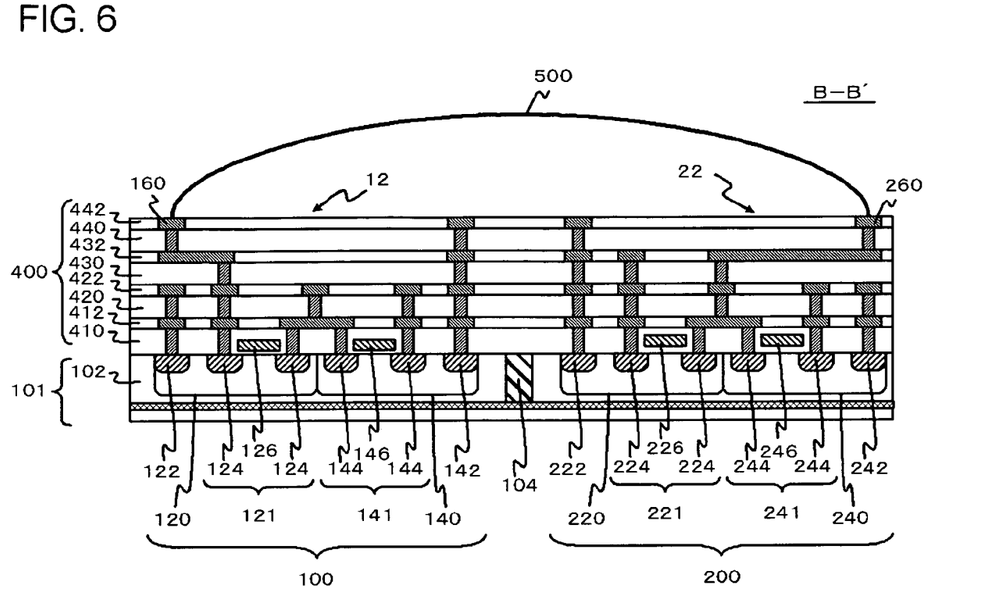
FIG. 6 is a cross-sectional view of the semiconductor device, taken along the line B-B' of FIG. 5.

FIG. 5 is a schematic plan view of a semiconductor device according to a third embodiment. FIG. 6 is a cross-sectional view of the semiconductor device, taken along the line B-B' of FIG. 5. FIG. 5 is equivalent to FIG. 1 illustrating the first embodiment, and FIG. 6 is equivalent to FIG. 2 illustrating the first embodiment. The semiconductor device according to this embodiment is the same as the semiconductor device according to the first embodiment, except that each of the components formed in the first semiconductor chip 10 and each of the components formed in the second semiconductor chip 20 are formed on a same SOI substrate 101.

More specifically, each of the components formed in the first semiconductor chip 10 is formed in a first region 12, and each of the components formed in the second semiconductor chip 20 is formed in a second region 22. The first region 12 and the second region 22 have reference potential isolated from each other by an insulating layer 104 that is buried in a silicon layer 102 of the SOI substrate 101.

A first connecting terminal 160, a second connecting terminal 162, an interconnect 166, a fifth connecting terminal 164, and a sixth connecting terminal 168 are formed on a side of the SOI substrate 101. A third connecting terminal 260, a fourth connecting terminal 262, an interconnect 266, a seventh connecting terminal 264, and an eighth connecting terminal 268 are formed on a side of the SOI substrate 101, with the side being located on the opposite side from the first connecting terminal 160.

This embodiment can also achieve the same effects as those of the first embodiment. In the second embodiment, each of the components may be formed on the SOI substrate 101 as in this embodiment.

Figure 7:
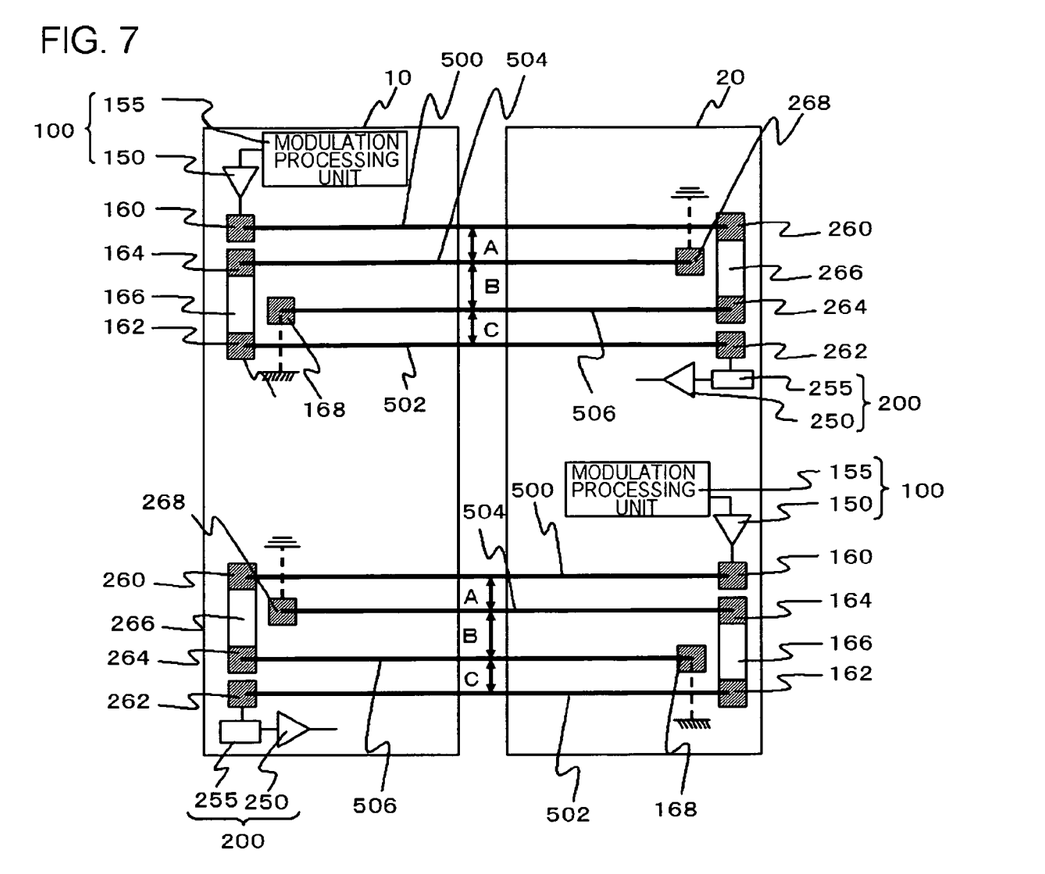
FIG. 7 is a schematic plan view showing the structure of a semiconductor device according to a fourth embodiment.

FIG. 7 is a schematic plan view showing the structure of a semiconductor device according to a fourth embodiment. In this semiconductor device, a first semiconductor chip 10 and a second semiconductor chip 20 perform bidirectional communications.

In this embodiment, the first semiconductor chip 10 and the second semiconductor chip 20 each include the components of both the first semiconductor chip 10 and the second semiconductor chip 20 of the first embodiment.

This embodiment can also achieve the same effects as those of the first embodiment. In this embodiment, the structures of the first inductor and the second inductor may be the same as those of the second embodiment.

Although embodiments of the present invention have been described so far with reference to the accompanying drawings, those embodiments are merely examples of the present invention, and various structures other than the above described ones may be employed.

It is apparent that the present invention is not limited to the above embodiment, but may be modified and changed without departing from the scope and spirit of the invention.

What is claimed is:

1. A semiconductor device comprising:
a first region that includes a transmission circuit, a first connecting terminal, and a second connecting terminal;
a second region that is placed alongside said first region, has a reference potential isolated from said first region, and includes a reception circuit, a third connecting terminal, and a fourth connecting terminal;
a first inductor that is connected to said transmission circuit;
a second inductor that is connected to said reception circuit, and is inductively coupled to said first inductor;
a first bonding wire that forms at least part of said first inductor, and has two ends connected to said first connecting terminal and said third connecting terminal;
a second bonding wire that forms at least part of said second inductor, and has two ends connected to said second connecting terminal and said fourth connecting terminal;
a fifth connecting terminal formed in the first region and is connected to the second connecting terminal;
a sixth connecting terminal that is formed in the first region;
a seventh connecting terminal that is formed in the second region and is connected to the third connecting terminal;
an eighth connecting terminal at is formed in the second region;
a third bonding that has two ends connected to the sixth connecting terminal and the seventh connecting terminal, and forms part of the first inductor; and
a fourth bonding wire that has two ends connected to the fifth connecting terminal and the eighth connecting terminal, and forms part of the second inductor.

2. The semiconductor device as claimed in claim 1, wherein said first connecting terminal is connected to said transmission circuit, and
said fourth connecting terminal is connected to said reception circuit.

3. The semiconductor device as claimed in claim 1, wherein said sixth connecting terminal is connected to a reference potential of said first region, and
said eighth connecting terminal is connected to a reference potential of said second region.

4. The semiconductor device as claimed in claim 1, wherein said first connecting terminal and said second connecting terminal are located on an opposite side from said second region, with a center point of said first region being a reference point, and
said third connecting terminal and said fourth connecting terminal are located on an opposite side from said first region, with a center point of said second region being a reference point.

5. The semiconductor device as claimed in claim 4, wherein planar shapes of said first region and said second region are rectangles or squares,
said first connecting terminal and said second connecting terminal are formed on a side located on the opposite side from said second region, and
said third connecting terminal and said fourth connecting terminal are formed on a side located on the opposite side from said first region.

6. The semiconductor device as claimed in claim 1, wherein said third bonding wire is located between said first bonding wire and said second bonding wire, and
said fourth bonding wire is located between said first bonding wire and said third bonding wire.

7. The semiconductor device as claimed in claim 6, wherein a distance between said third bonding wire and said fourth bonding wire is longer than a distance between said first bonding wire and said fourth bonding wire, and a distance between said second bonding wire and said third bonding wire.

8. The semiconductor device as claimed in claim 1, further comprising:
a ninth connecting terminal, a tenth connecting terminal, an eleventh connecting terminal, and a twelfth connecting terminal, that are provided in said first region;
a fifth bonding wire that has two ends connected to said ninth connecting terminal and said tenth connecting terminal; and
a sixth bonding wire that has two ends connected to said eleventh connecting terminal and said twelfth connecting terminal,
wherein said ninth connecting terminal is connected to said first connecting terminal,
said tenth connecting terminal is connected to said transmission circuit, and
said eleventh connecting terminal is connected to said second connecting terminal.

9. The semiconductor device as claimed in claim 1, further comprising:
a thirteenth connecting terminal, a fourteenth connecting terminal, a fifteenth connecting terminal, and a sixteenth connecting terminal that are provided in said second region;
a seventh bonding wire that has two ends connected to said thirteenth connecting terminal and said fourteenth connecting terminal; and
an eighth bonding wire that has two ends connected to said fifteenth connecting terminal and said sixteenth connecting terminal,
wherein said thirteenth connecting terminal is connected to said third connecting terminal,
said fifteenth connecting terminal is connected to said fourth connecting terminal, and
said sixteenth connecting terminal is connected to said reception circuit.

10. The semiconductor device as claimed in claim 1, further comprising:
a semiconductor chip in which at least said first region is provided;
an interconnect substrate on which said semiconductor chip is mounted; and
a connecting bonding wire that connects said interconnect substrate and said first region,
wherein said first bonding wire and said second bonding wire each have a top portion that is located higher than a top portion of said connecting bonding wire.

11. The semiconductor device as claimed in claim 1, wherein said first region is provided in a first semiconductor chip, and
said second region is provided in a second semiconductor chip.

12. The semiconductor device as claimed in claim 1, wherein said first region and said second region are provided on a same silicon on insulator (SOI) substrate, and a reference potential of said first region and the reference potential of said second region are isolated from each other by an insulating layer that is buried in a silicon layer of said SOI substrate.

13. The semiconductor device according to claim 1, wherein the transmission circuit comprises a modulation processing unit that modulates a signal into a signal to be transmitted to the reception circuit.

14. The semiconductor device according to claim 1, wherein the transmission circuit further comprises a transmission-side driver circuit that outputs the modulated signal to the first connecting terminal.

15. The semiconductor device according to claim 1, wherein the reception circuit comprises a demodulation circuit that is connected to the fourth connecting terminal.

16. The semiconductor device according to claim 15, wherein the demodulation circuit demodulates a modulated signal transmitted by the transmission circuit into a digital signal.

17. The semiconductor device according to claim 1, wherein the third bonding wire returns the first inductor to the first region.

18. The semiconductor device according to claim 1, wherein the third bonding wire is located between the first bonding wire and the second bonding wire.

19. A semiconductor device comprising:
- a first region that includes a transmission circuit, a first connecting terminal, and a second connecting terminal;
- a second region that is placed alongside said first region, has a reference potential isolated from said first region, and includes a reception circuit, a third connecting terminal, and a fourth connecting terminal;
- a first inductor that is connected to said transmission circuit;
- a second inductor that is connected to said reception circuit, and is inductively coupled to said first inductor;
- a first bonding wire that forms at least part of said first inductor, and has two ends connected to said first connecting terminal and said third connecting terminal; and
- a second bonding wire that forms at least part of said second inductor, and has two ends connected to said second connecting terminal and said fourth connecting terminal;

wherein said first connecting terminal and said second connecting terminal are located on an opposite side from said second region, with a center point of said first region being a reference point, and said third connecting terminal and said fourth connecting terminal are located on an opposite side from said first region, with a center point of said second region being a reference point.

20. A semiconductor device comprising:
- a first region that includes a transmission circuit, a first connecting terminal, and a second connecting terminal;
- a second region that is placed alongside said first region, has a reference potential isolated from said first region, and includes a reception circuit, a third connecting terminal, and a fourth connecting terminal;
- a first inductor that is connected to said transmission circuit;
- a second inductor that is connected to said reception circuit, and is inductively coupled to said first inductor;
- a first bonding wire that forms at least part of said first inductor, and has two ends connected to said first connecting terminal and said third connecting terminal; and
- a second bonding wire that forms at least part of said second inductor, and has two ends connected to said second connecting terminal and said fourth connecting terminal, wherein said first region and said second region are provided on a same silicon on insulator (SOI) substrate, and a reference potential of said first region and the reference potential of said second region are isolated from each other by an insulating layer that is buried in a silicon layer of said SOI substrate.

* * * * *